(12) United States Patent
Kim et al.

(10) Patent No.: US 12,279,486 B2
(45) Date of Patent: Apr. 15, 2025

(54) DISPLAY DEVICE WITH PIXEL ELECTRODE OVERLAPPING ONLY A PORTION OF CONTACT HOLE

(71) Applicant: Samsung Display Co., Ltd., Yongin-Si (KR)

(72) Inventors: Su Jeong Kim, Seoul (KR); Sun-Kyu Joo, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 783 days.

(21) Appl. No.: 17/398,403

(22) Filed: Aug. 10, 2021

(65) Prior Publication Data

US 2022/0123080 A1    Apr. 21, 2022

(30) Foreign Application Priority Data

Oct. 15, 2020 (KR) .................. 10-2020-0133313

(51) Int. Cl.
*H10K 59/124* (2023.01)
*H10K 59/131* (2023.01)

(52) U.S. Cl.
CPC ......... *H10K 59/124* (2023.02); *H10K 59/131* (2023.02)

(58) Field of Classification Search
CPC .................... H10K 29/124; H10K 29/131
See application file for complete search history.

(56) References Cited

U.S. PATENT DOCUMENTS

2016/0155983 A1* 6/2016 Lee ................. H10K 59/8791
257/40

FOREIGN PATENT DOCUMENTS

| JP | 2000187242 | A | * | 7/2000 | ....... G02F 1/136227 |
|---|---|---|---|---|---|
| JP | 4668280 | B2 | | 4/2011 | |
| KR | 1019980038935 | A | | 8/1998 | |
| KR | 1020030079428 | A | | 10/2003 | |
| KR | 1020050029426 | A | | 3/2005 | |
| KR | 100992142 | B1 | | 11/2010 | |
| KR | 101327832 | B1 | | 11/2013 | |
| KR | 1020150062214 | A | | 6/2015 | |
| KR | 1020160021557 | A | | 2/2016 | |
| KR | 1020160024607 | A | | 3/2016 | |
| KR | 1020160096997 | A | | 8/2016 | |
| KR | 1020160106337 | A | | 9/2016 | |
| KR | 1020170082687 | A | | 7/2017 | |
| KR | 1020170105877 | A | | 9/2017 | |
| KR | 101803991 | B1 | | 12/2017 | |
| KR | 101859105 | B1 | | 5/2018 | |
| KR | 1020180113783 | A | | 10/2018 | |
| KR | 1020190097914 | A | | 8/2019 | |

* cited by examiner

*Primary Examiner* — Lex H Malsawma

(74) *Attorney, Agent, or Firm* — CANTOR COLBURN LLP

(57) ABSTRACT

A display device includes: a substrate; a thin film transistor disposed on the substrate; an insulation layer disposed on the thin film transistor and defining a contact hole; a pixel electrode disposed on the insulation layer and overlapping a portion of the contact hole in a plan view; and a light emitting layer disposed on the pixel electrode. The pixel electrode includes: a first portion overlapping the light emitting layer in the plan view; a second portion overlapping a portion of a lower surface of the contact hole in the plan view; and a third portion extending from the first portion to the second portion.

20 Claims, 14 Drawing Sheets

DISPLAY DEVICE WITH PIXEL ELECTRODE OVERLAPPING ONLY A PORTION OF CONTACT HOLE

This application claims priority to Korean Patent Application No. 10-2020-0133313 filed on Oct. 15, 2020, and all the benefits accruing therefrom under 35 U.S.C. § 119, the content of which in its entirety is herein incorporated by reference.

BACKGROUND

1. Field

Embodiments relate to a display device. More specifically, embodiments relate to a display device with improved reflection color separation.

2. Description of the Related Art

The display device is a device that displays an image for providing visual information to a user. Among display devices, an organic light emitting diode display has recently attracted attention.

The organic light-emitting display device has a self-emission characteristic and does not require a separate light source, unlike a liquid crystal display device, so that the thickness and weight may be reduced. In addition, the organic light emitting diode display exhibits high quality characteristics such as low power consumption, high luminance, and high reaction speed.

SUMMARY

Embodiments provide a display device with improved reflection color separation.

A display device according to an embodiment includes: a substrate; a thin film transistor disposed on the substrate; an insulation layer disposed on the thin film transistor and defining a contact hole; a pixel electrode disposed on the insulation layer and overlapping a portion of the contact hole in a plan view; and a light emitting layer disposed on the pixel electrode. The pixel electrode includes: a first portion overlapping the light emitting layer in the plan view; a second portion overlapping a portion of a lower surface of the contact hole in the plan view; and a third portion extending from the first portion to the second portion.

In an embodiment, the contact hole may penetrate the insulation layer, and the lower surface of the contact hole may expose a portion of the thin film transistor.

In an embodiment, the second portion may be an end portion of the pixel electrode and disposed on the lower surface of the contact hole.

In an embodiment, the contact hole may be defined in a first direction from the light emitting layer in the plan view, and a maximum length of the contact hole in the first direction may be greater than a maximum length of the contact hole in a second direction crossing the first direction.

In an embodiment, the contact hole may have an elliptical shape in the plan view.

In an embodiment, the contact hole may have a water droplet shape in the plan view.

In an embodiment, the second portion may contact the thin film transistor through the contact hole.

In an embodiment, the thin film transistor may include: an active layer; a gate electrode disposed on the active layer; and a source electrode and a drain electrode disposed on the gate electrode and electrically connected to the active layer, and the second portion may overlap at least one of the source electrode and the drain electrode in the plan view.

A display device according to an embodiment includes a substrate; a thin film transistor disposed on the substrate; an insulation layer disposed on the thin film transistor and defining a contact hole; a pixel electrode overlapping the contact hole in a plan view and disposed on the insulation layer; and a light emitting layer disposed on the pixel electrode. The contact hole may be defined in a first direction from the light emitting layer in the plan view, and a maximum length of the contact hole in the first direction may be greater than a maximum length of the contact hole in a second direction crossing the first direction.

In an embodiment, the contact hole may have an elliptical shape in the plan view.

In an embodiment, the contact hole may have a water droplet shape in the plan view.

In an embodiment, an angle of at least a portion between a side surface of the contact hole and a lower surface of the contact hole may be about 170 degrees or more.

In an embodiment, the contact hole may penetrate the insulation layer, and the pixel electrode contacts the thin film transistor through the contact hole.

A display device according to an embodiment includes a substrate; a wiring disposed on the substrate; an insulation layer disposed on the wiring and including a flat portion overlapping the wiring in a plan view and a first stepped portion and a second stepped portion disposed on opposite sides of the flat portion; a pixel electrode disposed on the insulation layer and defining an opening; and a light emitting layer disposed on the pixel electrode. The opening overlaps at least one of the flat portion, the first stepped portion, and the second stepped portion in the plan view.

In an embodiment, a height from the substrate to an upper surface of the flat portion may be greater than a height from the substrate to an upper surface of a portion of the insulation layer overlapping the pixel electrode in the plan view.

In an embodiment, the opening may overlap the first stepped portion, the second stepped portion, and the flat portion in the plan view.

In an embodiment, the opening may include a first opening and a second opening, and the first opening and the second opening may overlap the first stepped portion and the second stepped portion in the plan view, respectively.

In an embodiment, the opening may have one of a circular shape and a square shape in the plan view.

In an embodiment, the display device may further include a low reflection layer disposed between the insulation layer and the pixel electrode, and overlapping the opening in the plan view.

In an embodiment, the low reflection layer may include a metal, and a reflectance of the low reflection layer may be lower than a reflectance of the pixel electrode.

In a display device according to embodiments of the present invention, a pixel electrode may overlap a lower surface of the contact hole, so that a reflection color separation may be effectively reduced and a white light may be emitted. That is, since a portion that is disposed on a side surface of the contact hole far from a light emitting layer is removed, a reflection color separation may be effectively reduced.

In the display device according to embodiments, an upper surface of the pixel electrode may be formed to be flat by removing a stepped portion of the pixel electrode. That is, the stepped portion of the pixel electrode may be removed by forming the opening of the pixel electrode in the stepped portion. Accordingly, a diffused reflection may be effectively reduced.

DETAILED DESCRIPTION

Figure 1:
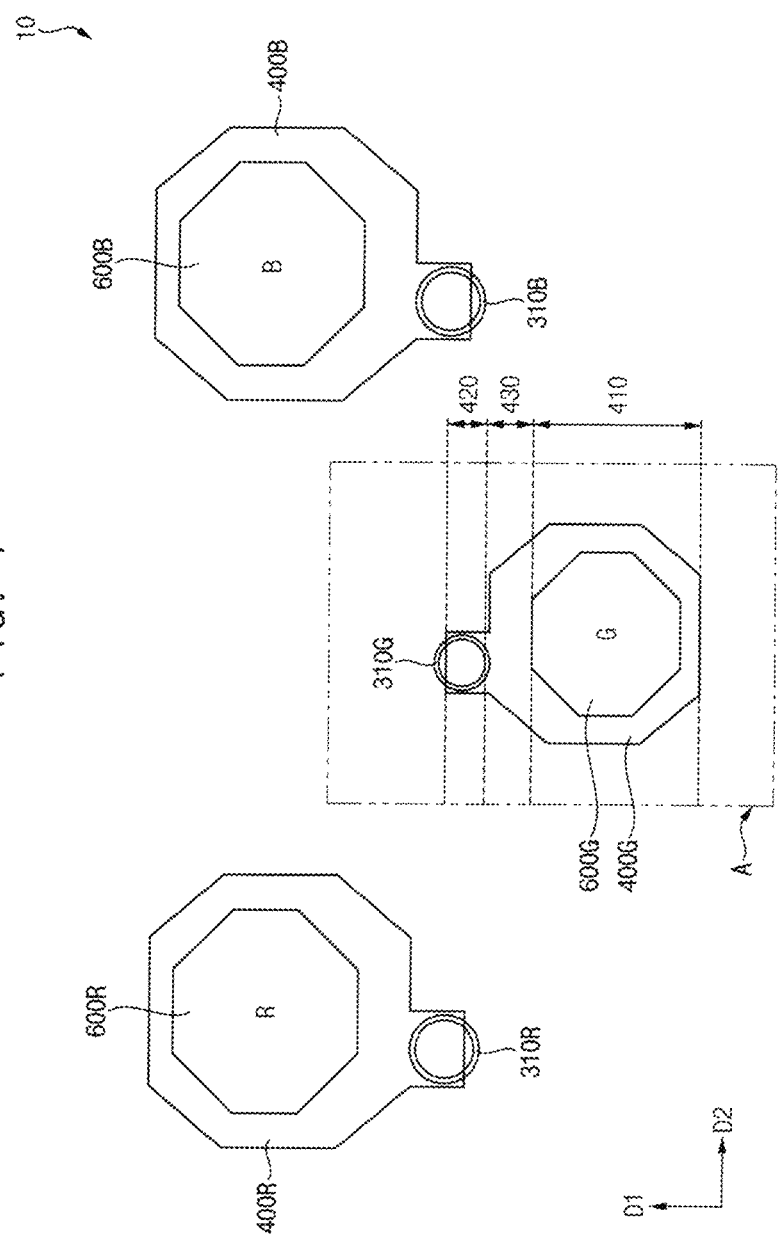
FIG. 1 is a plan view illustrating a display device according to an embodiment of the present invention.

It will be understood that when an element is referred to as being "on" another element, it can be directly on the other element or intervening elements may be present therebetween. In contrast, when an element is referred to as being "directly on" another element, there are no intervening elements present. It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Hereinafter, display devices in accordance with embodiments will be described in more detail with reference to the accompanying drawings. The same reference numerals are used for the same components in the drawings, and redundant descriptions of the same components will be omitted.

Figure 2:
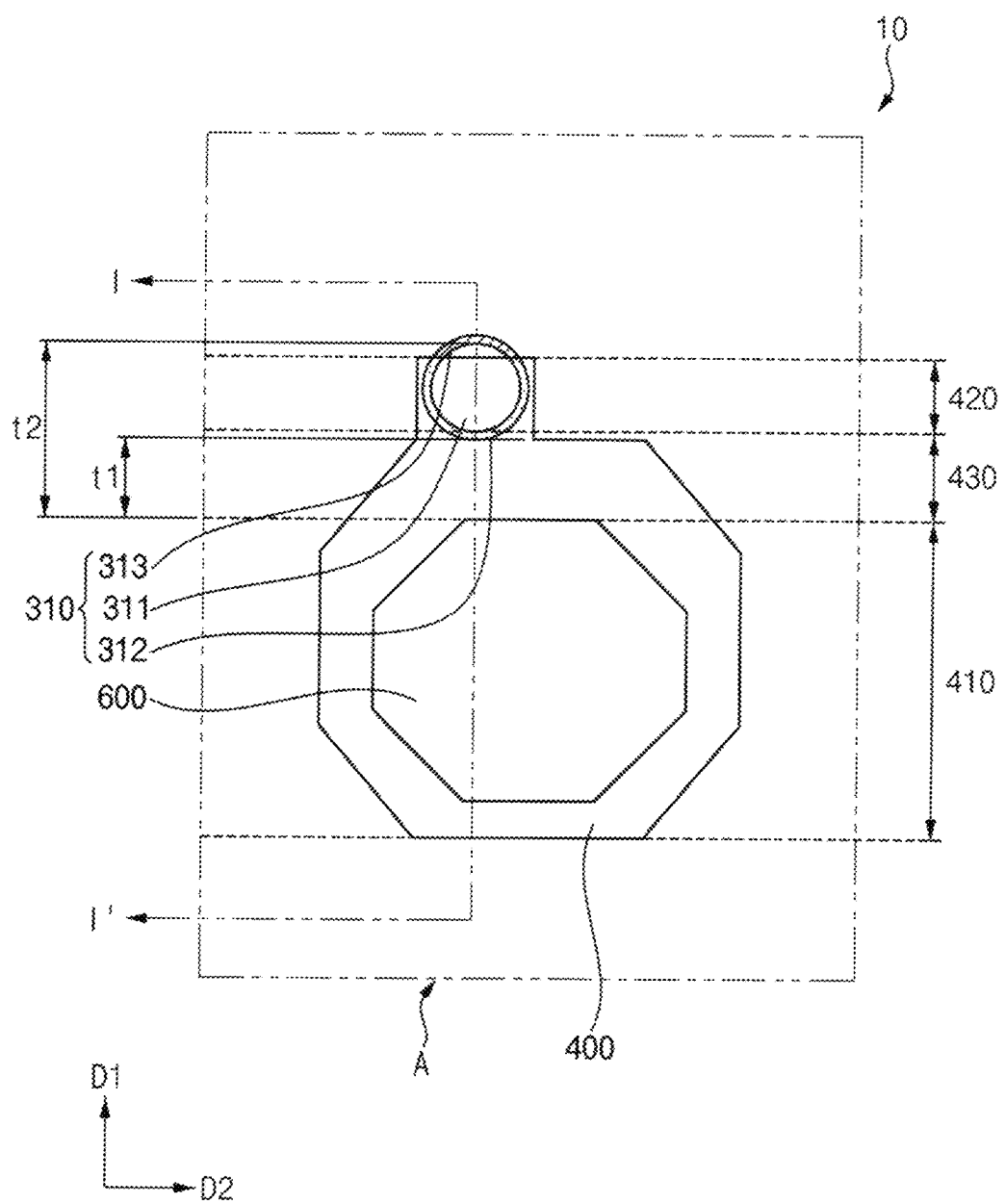
FIG. 2 is an enlarged plan view of area A of FIG. 1.
Figure 3:
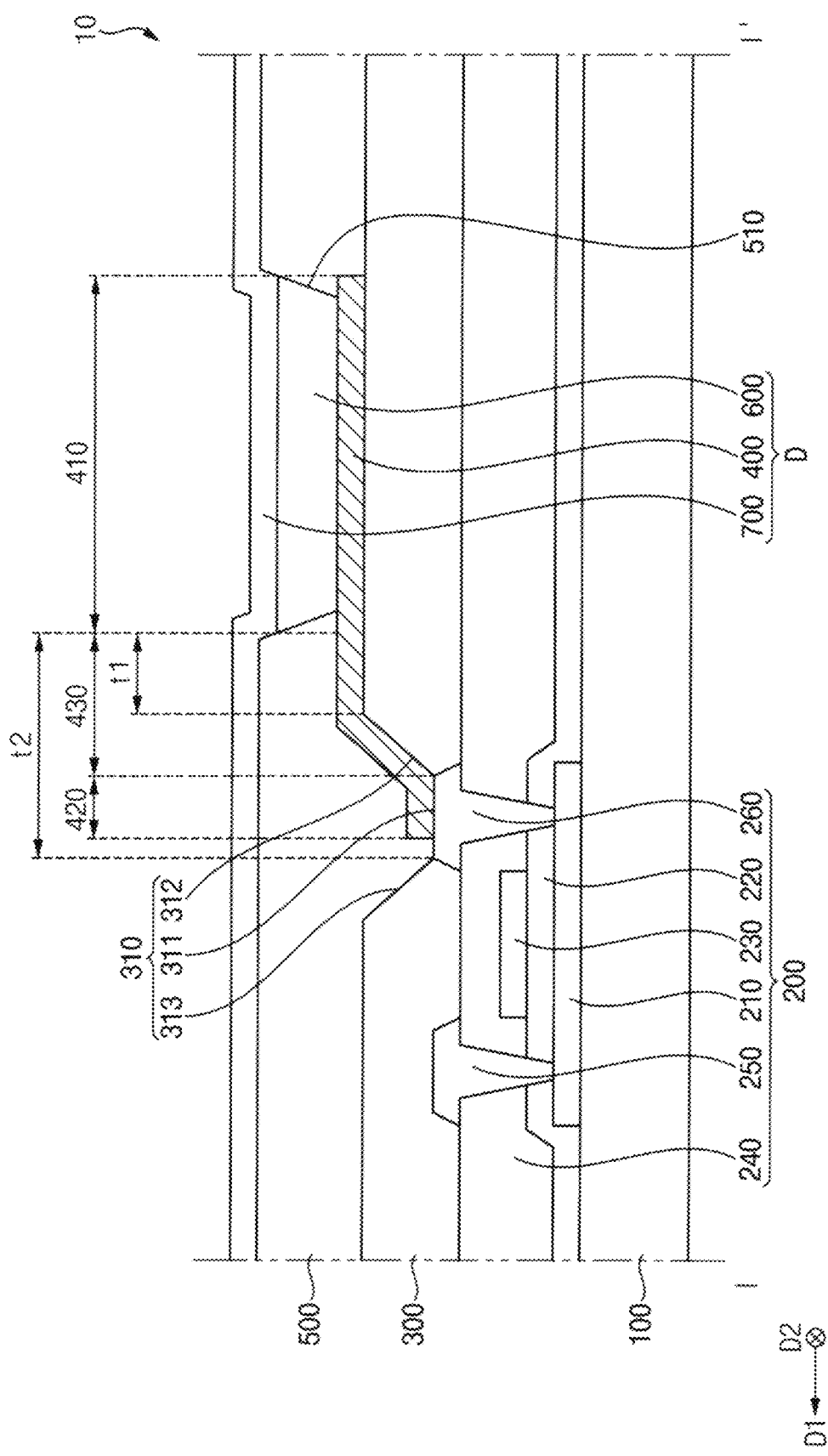
FIG. 3 is a cross-sectional view taken along line I-I' of FIG. 2.

FIG. 1 is a plan view illustrating a display device according to an embodiment of the present invention. FIG. 2 is an enlarged plan view of area A of FIG. 1. FIG. 3 is a cross-sectional view taken along line I-I' of FIG. 2.

Referring to FIGS. 1 and 2, a display device 10 according to an embodiment may include a first light emitting device R, a second light emitting device G, and a third light emitting device B. The first light emitting device R may include a first pixel electrode 400R, a first light-emitting layer 600R, and a first contact hole 310R. The second light emitting device G may include a second pixel electrode 400G, a second light emitting layer 600G, and a second contact hole 310G. The third light emitting device B may include a third pixel electrode 400B, a third light emitting layer 600B, and a third contact hole 310B. A contact hole 310 may include the first contact hole 310R, the second contact hole 310G, and the third contact hole 310B. In addition, a light-emitting layer 600 in this specification may include the first light-emitting layer 600R, the second light-emitting layer 600G, and the third light emitting layer 600B. The pixel electrode 400 may include the first pixel electrode 400R, the second pixel electrode 400G and the third pixel electrode 400B.

Referring to FIGS. 2 and 3, the display device 10 may include a substrate 100, a thin film transistor 200, an insulation layer 300, a pixel electrode 400, a pixel defining layer 500, a light emitting layer 600 and a common electrode 700.

The substrate 100 may be an insulating substrate including glass, polymer, or stainless steel. The substrate 100 may be flexible, stretchable, foldable, bendable, or rollable. When the substrate 100 is flexible, stretchable, foldable, bendable, or rollable, the display device 10 may be flexible, stretchable, foldable, bendable, or rollable.

The thin film transistor 200 may be disposed on the substrate 100. The thin film transistor 200 may include an active layer 210, a gate insulation layer 220, a gate electrode 230, an interlayer-insulation layer 240, a source electrode 250, and a drain electrode 260. The active layer 210 may include polycrystalline silicon, amorphous silicon, or an oxide semiconductor.

The gate insulation layer 220 may be disposed on the active layer 210. The gate electrode 230 may be disposed on the gate insulation layer 220. The gate electrode 230 may be insulated from the active layer 210 by the gate insulation layer 220. The gate insulation layer 220 may be disposed to overlap the entire surface of the substrate 100 in a plan view. The gate insulation layer 220 may include an inorganic insulating material such as silicon oxide (SiOx) or silicon nitride (SiNx).

A buffer layer (not shown) may be disposed between the gate insulation layer 220 and the substrate 100. The buffer layer may flatten one surface of the substrate 100 or prevent impurities from spreading.

The interlayer-insulation layer 240 may be disposed on the gate electrode 230. The interlayer-insulation layer 240 may include an inorganic insulating material or an organic insulating material. The source electrode 250 and the drain electrode 260 of the thin film transistor 200, a data line, and a signal line may be disposed on the interlayer-insulation layer 240. Each of the source electrode 250 and the drain electrode 260 may contact a region of the active layer 210 through openings of the interlayer-insulation layer 240 and may be electrically connected to the active layer 210. For example, the source electrode 250 and the drain electrode 260 may contact the source region and the drain region of the active layer 210, respectively.

The thin film transistor 200 illustrated in FIG. 3 may be referred to as a top-gate transistor because the gate electrode 230 is disposed above the active layer 210. The structure of the thin film transistor 200 according to the invention is not limited thereto, and may be variously changed, and for example, the thin film transistor 200 may be a bottom-gate transistor in another embodiment. The bottom-gate transistor may be a structure which the gate electrode 230 is disposed under the active layer 210.

The insulation layer 300 may be disposed on the interlayer-insulation layer 240. The insulation layer 300 may serve to eliminate and flatten a step underneath the insulation layer 300 in order to increase the luminous efficiency of the light emitting layer 600. The insulation layer 300 may overlap the thin film transistor 200 and cover the thin film transistor 200 in a plan view. The insulation layer 300 may include, for example, an organic insulating material. The organic insulating material may include polyimide, polyamide, polyacrylate, unsaturated polyester, epoxy resin, phenol resin, and the like, but the invention is not limited to.

The insulation layer 300 may define a contact hole 310. The contact hole 310 may mean a portion that penetrates the insulation layer 300 by removing a portion of the insulation layer 300. The contact hole 310 may include side surfaces 312 and 313 and a lower surface 311. The side surfaces 312 and 313 of the contact hole 310 may mean a cut surface in which the portion of the insulation layer 300 is cut. The lower surface 311 of the contact hole 310 may mean a portion where the insulation layer 300 is penetrated and through which the thin film transistor 200 is exposed.

The second portion 420 of the pixel electrode 400 may be disposed on the lower surface 311 of the contact hole 310, and the second portion 420 of the pixel electrode 400 may contact the thin film transistor 200 through the lower surface 311 of the contact hole 310.

The shape of the contact hole 310 may be circular in a plan view. The side surfaces 312 and 313 of the contact hole 310 may include a first side surface 312 adjacent to the light emitting layer 600 and a second side surface 313 farther than the first side surface 312 from the light emitting layer 600 in the first direction D1. That is, the distance t1 between the first side surface 312 and the light emitting layer 600 may be shorter than the distance t2 between the second side surface 313 and the light emitting layer 600 as shown in FIG. 3.

The pixel electrode 400 may be disposed on the insulation layer 300. The pixel electrode 400 may overlap a portion of the contact hole 310 in a plan view. The pixel electrode 400 may contact at least one of the source electrode 250 and the drain electrode 260 of the thin film transistor 200 through the lower surface 311 of the contact hole 310.

The first side surface 312 of the contact hole 310 may mean a portion where the pixel electrode 400 and a side of the contact hole 310 overlap in a plan view, and the second side surface 313 may mean a side of the contact hole 310 where the pixel electrode 400 and the contact hole 310 do not overlap in a plan view. Specifically, the first side surface 312 may overlap a portion of the second portion 420 and the third portion 430 of the pixel electrode 400 in a plan view. For smooth connection between the pixel electrode 400 and the drain electrode 260, the area of the first side surface 312 may be larger than the area of the second side surface 313.

The pixel electrode 400 may include a reflective conductive material, a semi-transmissive conductive material, or a transparent conductive material. For example, the pixel electrode 400 may include at least one of the transparent conductive materials such as indium tin oxide ("ITO") and indium zinc oxide ("IZO"), lithium (Li), calcium (Ca), aluminum (Al), silver (Ag), magnesium (Mg) and gold (Au).

The pixel electrode 400 may include the first portion 410 overlapping the light emitting layer 600 in a plan view, the second portion 420 overlapping a portion of the lower surface 311 of the contact hole 310 in a plan view, and the third portion 430 extending from the first portion 410 to the second portion 420. The first to third portions 410, 420, and 430 of the pixel electrode 400 may be arranged in the order of the first portion 410, the third portion 430, and the second portion 420 in the first direction D1. The first direction D1 may be a direction from the light emitting layer 600 to the contact hole 310.

In the prior art, since the shape of the contact hole is circular and the pixel electrode overlaps an entirety of the contact hole in a plan view, the first red light reflected from the first contact hole and the first blue light reflected from the third contact hole may be combined. Therefore, a purple light may be emitted toward one direction. Also, in the second contact hole, a green light may be emitted by reflecting the first green light in a different direction. Accordingly, the purple light may be visually recognized in some areas and the green light may be visually recognized in some areas. That is, a reflection color separation may occur in a display device. That is, in the prior art, since the pixel electrode overlaps the entire side of the contact hole, external light may be reflected by the pixel electrode disposed on the side of the contact hole far from the light emitting layer among the two sides of the contact hole, thereby causing a reflection color separation.

However, in the embodiments of the present invention, since the pixel electrode 400 overlaps only the lower surface 311 and the first side surface 312 of the contact hole 310 in a plan view, the reflection color separation may be effectively reduced and white light may be emitted. That is, by removing a portion of the pixel electrode 400 disposed on the second side surface 313 of the contact hole 310 far from the light emitting layer 600, the reflection color separation may be effectively reduced.

If the reflection color separation may be effectively prevented, a polarizing plate required in the display device 10 may be omitted, thereby reducing the cost of producing the display device 10. In addition, by omitting the polarizing plate, the thickness of the display device 10 may be effectively reduced.

The first portion 410 may be the portion that overlaps the light emitting layer 600 in a plan view. The first portion 410 may overlap a portion of the insulation layer 300. The second portion 420 may be one end of the pixel electrode 400. The second portion 420 may be disposed on the lower surface 311 of the contact hole 310 and a portion of the first side surface 312 of the contact hole 310. Also, the second portion 420 may contact the one of the source electrode 250 and the drain electrode 260 of the thin film transistor 200 through the contact hole 310. The third portion 430 may be disposed between the first portion 410 and the second portion 420 and include an inclined surface or a step. The second portion 420 may have a concave shape with respect to the upper surface of the first portion 410.

The second portion 420 may overlap the first side surface 312 of the contact hole 310, and the second portion 420 may overlap a portion or an entirety of the lower surface 311 of the contact hole 310 in a plan view. The portion of the lower surface 311 of the contact hole 310 overlapping the second portion 420 may be a portion surrounded by the first side surface 312. When the pixel electrode 400 is formed, the second portion 420 may be formed by removing a portion overlapping the second side surface 313 of the contact hole 310. In other words, during the patterning process of forming the pixel electrode 400, the portion overlapping the second side surface 313 may be removed. Therefore, an external light may not be emitted by being reflected by the pixel electrode 400 on the second side surface 313. Therefore, the reflection color separation may be effectively reduced.

In the prior art, a contact hole may be disposed 3.5 micrometers or more departed from the light emitting layer. Therefore, the external light may be absorbed by the pixel defining layer and the external light may not be reflected by the pixel electrode. However, in this case, since the size of the pixel increases, the pixel may not be applied to a high-resolution display device.

In the display device 10 according to an embodiment, the contact hole 310 may be spaced apart from the light emitting layer 600 by 3.5 micrometers or less in a plan view. Accordingly, the size of the pixel may decrease, and the pixel may also be applied to the high-resolution display device.

The pixel defining layer 500 may be disposed on the insulation layer 300 and the pixel electrode 400. The pixel defining layer 500 may overlap a portion of the pixel electrode 400 in a plan view. The pixel defining layer 500 may absorb the external light coming from the outside through an opening portion 510 and may also absorb the light reflected by the pixel electrode 400.

The pixel defining layer 500 may define the opening portion 510 overlapping the pixel electrode 400 in a plan view. The opening portion 510 of the pixel defining layer 500 may be the area corresponding to the pixel. The opening portion 510 may have a polygonal shape or a circular shape in a plan view and may have the polygonal shape such as a square, triangle, a pentagon, a hexagon, a heptagon, an octagon and etc. The opening portion 510 may have the polygonal shape close to the circular shape.

The pixel defining layer 500 may include an organic insulating material such as polyimide, polyacrylate, or polyamide, but the invention is not limited thereto.

The light emitting layer 600 may be disposed on the pixel electrode 400. A hole injection layer and a hole transport layer may be additionally disposed between the light emitting layer 600 and the pixel electrode 400. An electron injection layer and an electron transport layer may be additionally disposed between the light emitting layer 600 and the common electrode 700.

The light emitting layer 600 may contain a material emitting a light of red, green and blue. The light emitting layer 600 may include the first light emitting layer 600R emitting light having a first wavelength, the second light emitting layer 600G emitting light having a second wavelength and the third light emitting layer 600B emitting light having a third wavelength (see FIG. 1). For example, the light having the first wavelength may represent red, and the light having the second wavelength may represent green and the light the third wavelength may represent blue.

The light emitting layer 600 may have a structure which a plurality of organic materials emitting the light of different colors is stacked. Alternatively, the light emitting layer 600 may contain an inorganic material emitting the light of red, green and blue.

The common electrode 700 transmitting a common voltage may be disposed on the light emitting layer 600. The common electrode 700 may contain a transparent conductive material such as indium tin oxide (ITO) and indium zinc oxide (IZO). The common electrode 700 may be formed to have light transmittance by stacking calcium (Ca), barium (Ba), magnesium (Mg), aluminum (Al), and silver (Ag).

The pixel electrode 400, the light emitting layer 600 and the common electrode 700 may form a light emitting device D that is a light emitting diode. The pixel electrode 400 may be an anode that is a hole injection electrode and the common electrode 700 may be a cathode that is an electron injection electrode. Conversely, the pixel electrode 400 may be the cathode, the common electrode 700 may be the anode. The hole and the electron may be injected into the light emitting layer from the pixel electrode 400 and the common electrode 700, respectively. When an exciton in which the injected holes and electrons are combined falls from an excited state to the ground state, the light emitting device D may emit light.

Although not shown in the drawing, the thin film encapsulation layer may be disposed on the common electrode 700. The thin film encapsulation layer may include a plurality of inorganic layers or may include a structure in which the inorganic layer and an organic layer are stacked.

Figure 4:
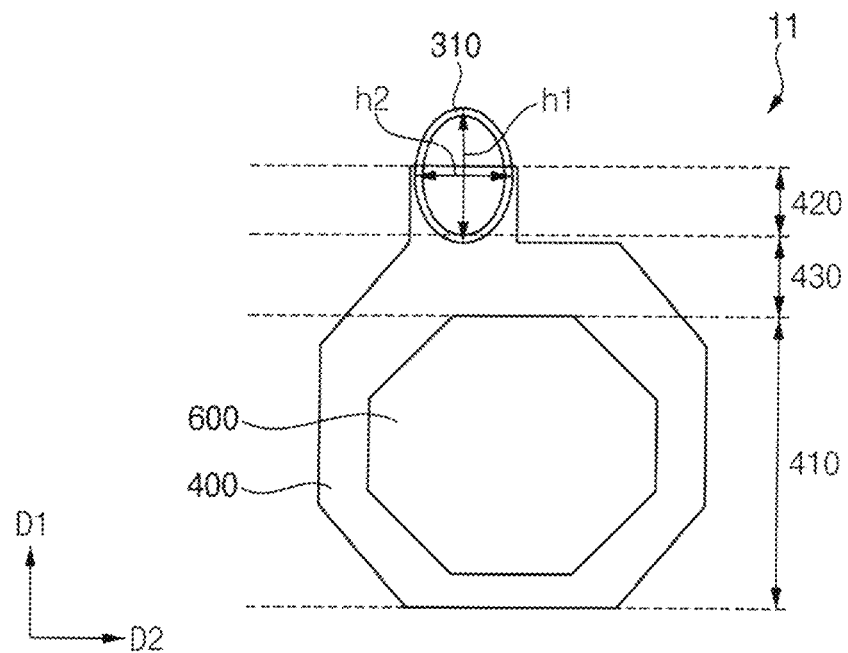
FIG. 4 is a plan view of a display device according to another embodiment.

FIG. 4 is a plan view of a display device according to another embodiment.

Referring to FIG. 4, a display device 11 according to an embodiment may define a contact hole 310. The contact hole 310 may be disposed in a first direction D1 from the light emitting layer 600 in a plan view. A length h1 of the contact hole 310 in the first direction D1 may be greater than a length h2 of the contact hole 310 in a second direction D2 crossing the first direction D1. The shape of the contact hole 310 may have an oval shape of which a longitudinal direction is the first direction D1. As used herein, the length (e.g., h1, h2, h3, and h4) of a contact hole is a maximum length measured on the top of the contact hole, not on the bottom of the contact hole (i.e., lower surface 311).

When the length h1 of the contact hole 310 in the first direction D1 is greater than the length h2 of the contact hole 310 in the second direction D2, the connection between the pixel electrode 400 and the drain electrode 260 may be secured since the contact area between the pixel electrode 400 and the drain electrode 260 is increased. In addition, when the pixel electrode 400 moves in the first direction D1 in the plan view, the second portion 420 of the pixel electrode 400 may be disposed inside the contact hole 310. That is, when the pixel electrode 400 moves in the first direction D1 in the plan view, the second portion 420 of the pixel electrode 400 may be disposed on the lower surface 311 of the contact hole 310 and may be connected to the drain electrode 260 (see FIG. 3).

Figure 5:
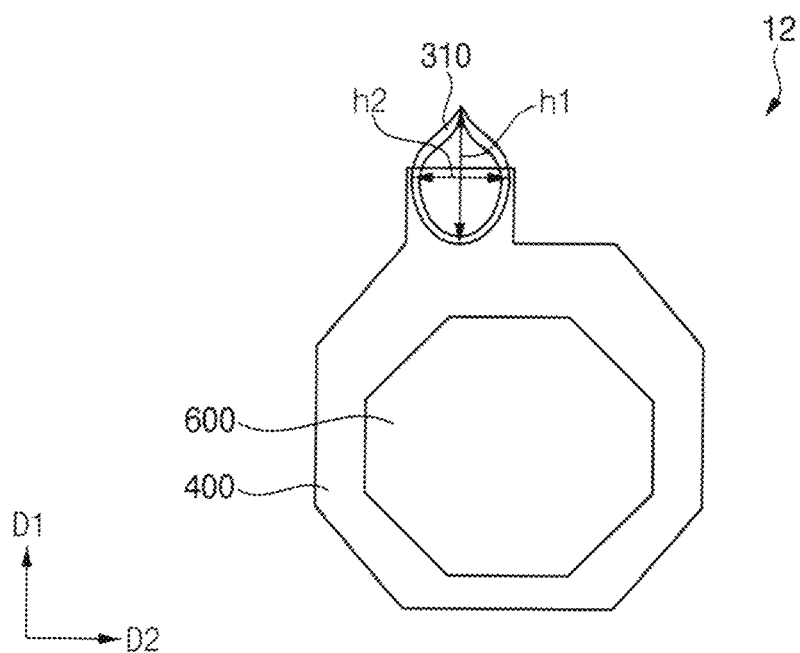
FIG. 5 is a plan view of a display device according to still another embodiment.

FIG. 5 is a plan view of a display device according to still another embodiment.

Referring to FIG. 5, a display device 12 according to an embodiment may define a contact hole 310. The length h1 of the contact hole 310 in the first direction D1 may be greater than the length h2 of the contact hole 310 in the second direction D2. The shape of the contact hole 310 may be a water droplet shape in the plan view, and a pointed portion of the water droplet shape may be directed to the first direction D1. However, the shape of the contact hole 310 according to the invention is not limited thereto, the contact hole 310 may have a different shape in another embodiment.

Figure 6:
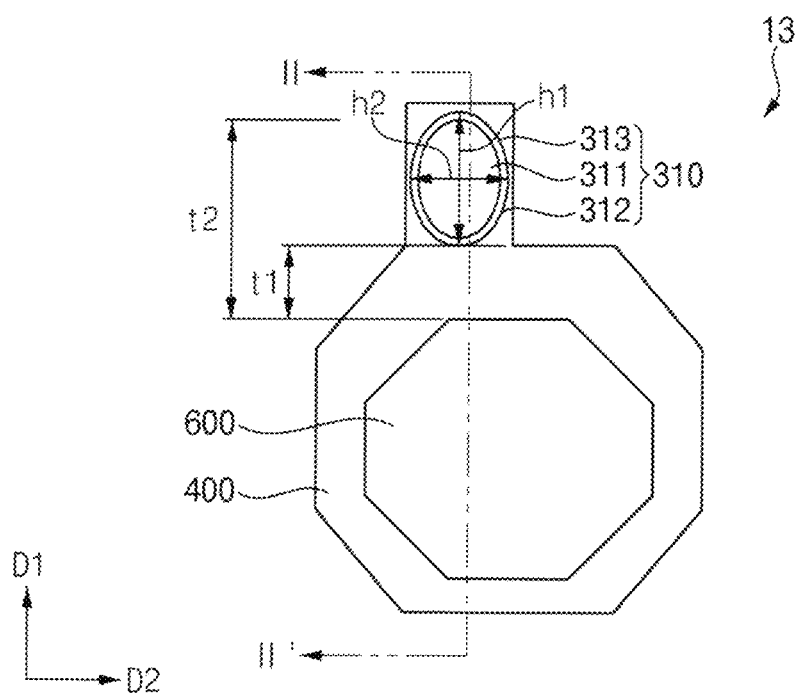
FIG. 6 is a plan view of a display device according to an embodiment of the present invention.
Figure 7:
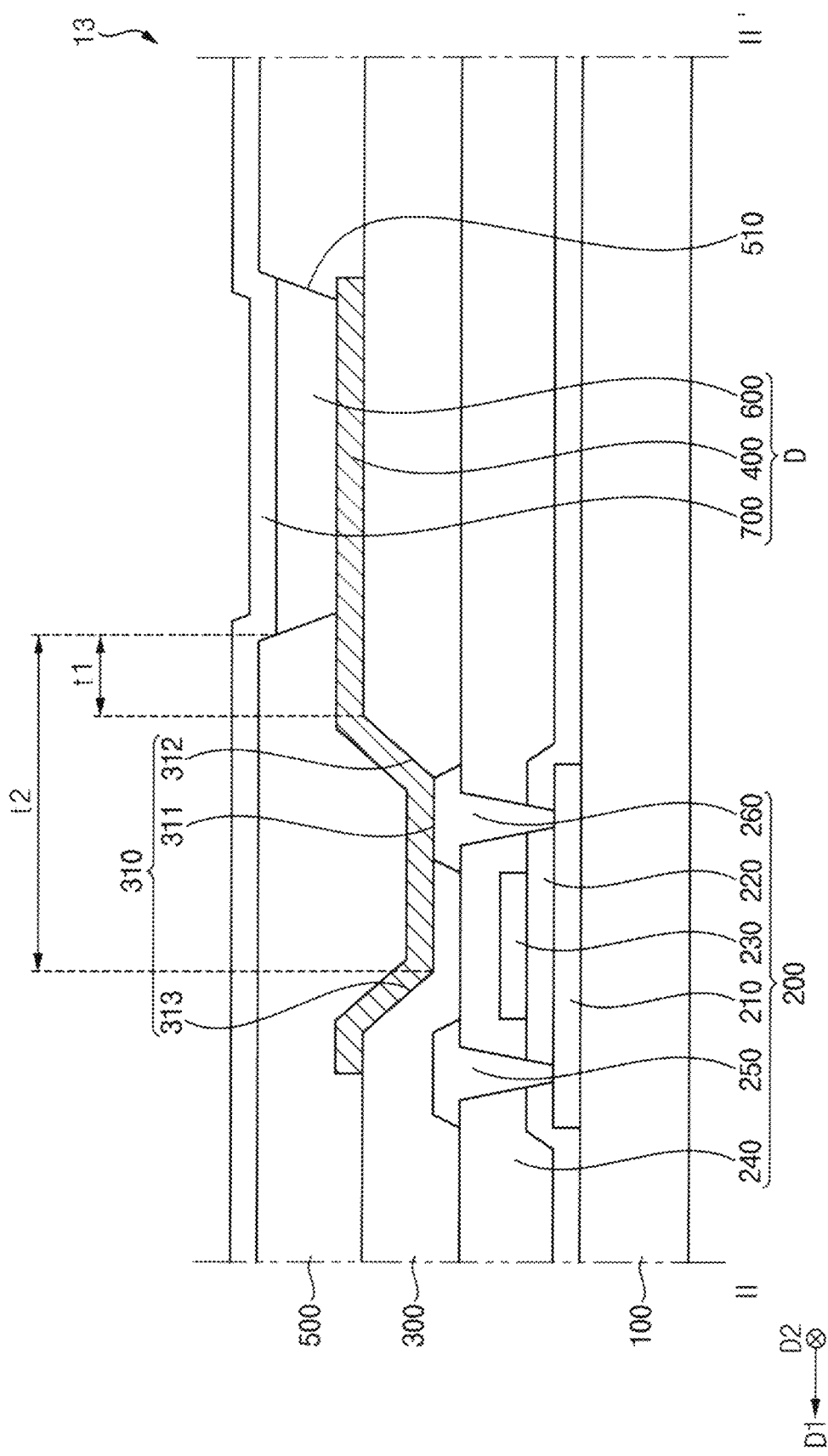
FIG. 7 is a cross-sectional view taken along line II-II' of FIG. 6.

FIG. 6 is a plan view of a display device according to an embodiment. FIG. 7 is a cross-sectional view taken along line II-IF of FIG. 6.

Referring to FIG. 6 and FIG. 7, a display device 13 according to an embodiment may include a substrate 100, a thin film transistor 200, an insulation layer 300, a pixel electrode 400, a pixel defining layer 500, a light emitting layer 600 and a common electrode 700. Also, the thin film transistor 200 may include an active layer 210, a gate insulation layer 220, a gate electrode 230, a source electrode 250 and a drain electrode 260. Among configurations of the display device 13 described with reference to FIGS. 6 and 7, the same configurations as those of the display device 10 described with reference to FIGS. 2 and 3 will be omitted below.

The insulation layer 300 may define the contact hole 310. The contact hole 310 may penetrate the insulation layer 300 and a lower surface 311 of the contact hole 310 may expose a portion of the thin film transistor 200. The pixel electrode 400 may be disposed over the entire contact hole 310, the pixel electrode 400 may contact with at least one of the source electrode 250 and the drain electrode 260 of the thin film transistor 200 through the lower surface 311 of the contact hole 310.

The contact hole 310 may be disposed in the first direction D1 from the light emitting layer 600 in a plan view. A length h1 of the contact hole 310 in the first direction D1 may be greater than a length h2 of the contact hole 310 in the second direction D2.

The contact hole 310 may include side surfaces 312, 313 and a lower surface 311. The side surfaces 312, 313 may include a first side surface 312 adjacent to the light emitting layer 600 and a second side surface 313 which is farther from the light emitting layer 600 in the first direction D1 among the sided surfaces 312 and 313. That is, a distance t1 between the first side surface 312 and the light emitting layer 600 may be shorter than a distance t2 between the second side surface 313 and the light emitting layer 600.

In the prior art, since a shape of a contact hole is circular shape, an external light may be reflected by a portion of a pixel electrode disposed on a portion of a side surface of the contact hole which is farther from a light emitting layer among the sided surfaces of the contact hole and a light of a specific color may be emitted. That is, since the shape of the contact hole is circular shape, a second side surface of the contact hole may be relatively close to an opening portion of a pixel defining layer. Accordingly, the external light may reach the pixel electrode disposed on the second side surface of the contact hole. The external light may be reflected by the pixel electrode and the light of the specific color may be emitted through the opening portion again, and thus the reflection color separation may occur.

However, in embodiments of the present invention, when the length h1 of the contact hole 310 in the first direction D1 is greater than the length h2 of the contact hole 310 in the second direction D2, the external light may not reach the portion of the pixel electrode 400 disposed on the second side surface 313 of the contact hole 310. That is, the external light coming from the opening portion MO may not reach the portion of the pixel electrode 400 disposed on the second side surface 313 and may be absorbed by the pixel defining layer 500. In addition, even if the external light reaches the portion of the pixel electrode 400 disposed on the second side surface 313, the light reflected by the portion of the pixel electrode 400 disposed on the second side surface 313 may not reach the opening portion 510 and may be absorbed by the pixel defining layer 500.

Figure 8:
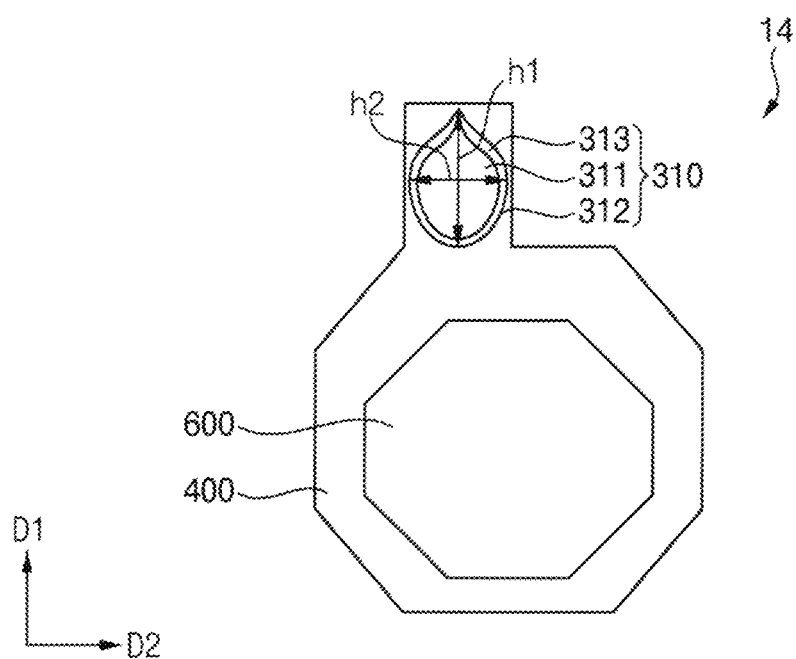
FIG. 8 is a plan view of a display device according to an embodiment.

FIG. 8 is a plan view of a display device according to an embodiment.

Referring to FIG. 8, the shape of the contact hole 310 may be a water droplet shape in the plan view, a pointed portion of the water droplet shape may be pointed in the first direction D1. However, if the length h1 of the contact hole in the first direction is greater than the length h2 of the contact hole 310 in the second direction D2, the shape of the contact hole 310 according to the invention is not limited thereto.

If the shape of the contact hole is the water droplet shape, the area of the second side surface 313 of the contact hole 310 may be decreased (see FIG. 7). That is, when the shape of the contact hole 310 is the water droplet shape in the plan view, the area of the pixel electrode 400 disposed on the second side surface 313 may be smaller than the area of the pixel electrode 400 disposed on the second side surface 313 when the shape of the contact hole 310 is a non-water droplet shape. Accordingly, the area of the pixel electrode 400 reflecting the external light may be decreased. Thus, the reflection color separation may be effectively reduced.

Figure 9:
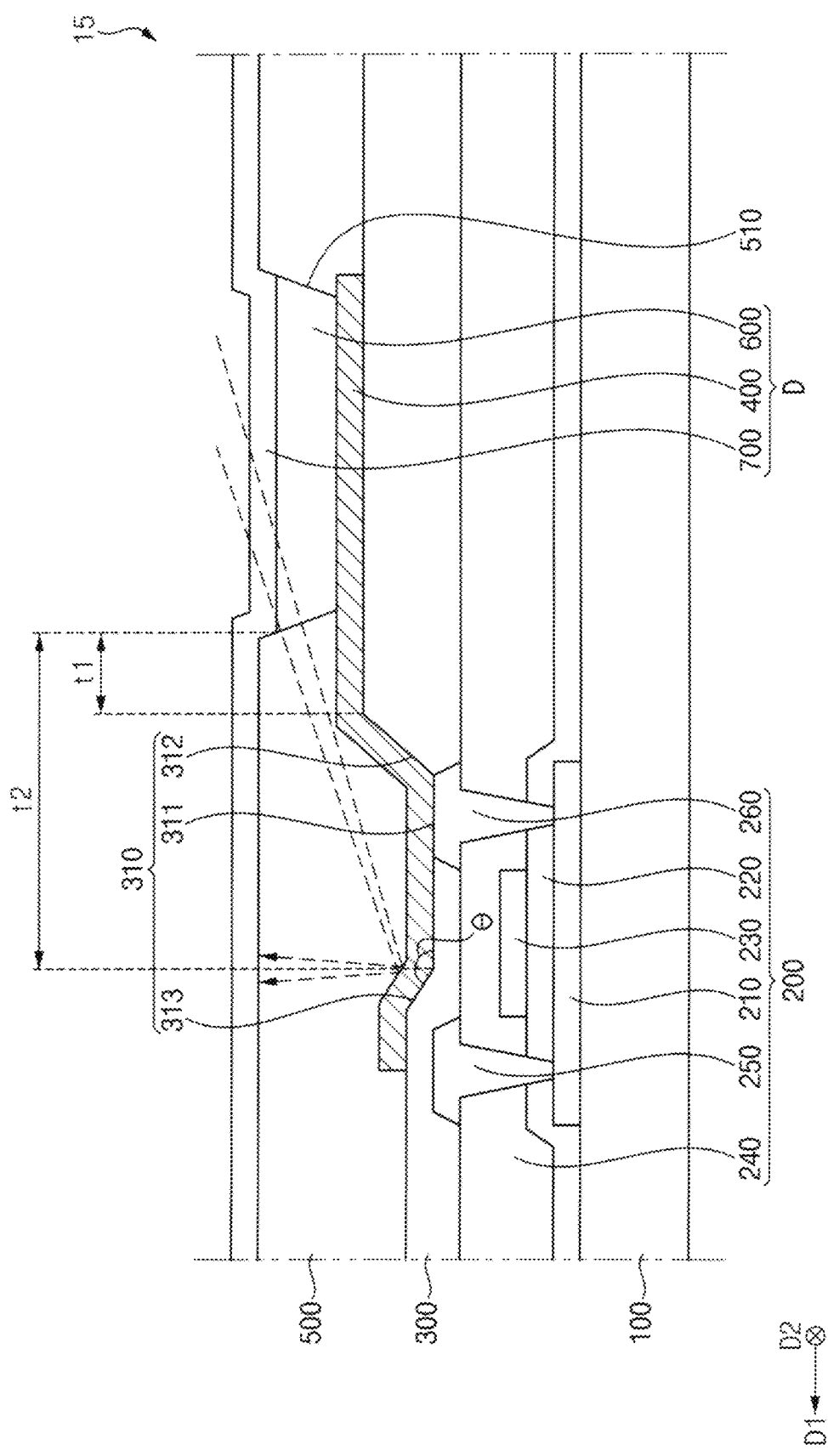
FIG. 9 is a cross-sectional view of a display device according to an embodiment.

FIG. 9 is a cross-sectional view of a display device according to an embodiment.

Referring to FIG. 9, a display device 15 according to an embodiment of the present invention may define the contact hole 310. The contact hole 310 may include the side surfaces 312, 313 and the lower surface 311. The side surfaces 312, 313 of the contact hole 310 may include the first side surface 312 adjacent to the light emitting layer 600 and the second side surface 313 which is farther from the light emitting layer 600 in the first direction D1 among the sided surfaces 312 and 313. That is, the distance t1 between the first side surface 312 and the light emitting layer 600 may be smaller than the distance t2 between the second side surface 313 and the light emitting layer 600.

An angle θ of at least a portion between the second side surface 313 of the contact hole 310 and the lower surface 311 of the contact hole may be about 170 degrees or more (i.e., between 170 and 180 degrees). That is, the angle θ of a portion of the second side surface 313 of the contact hole 310 with respect to the lower surface 311 of the contact hole 310 may be about 170 degrees or more. In other words, an angle θ between the entire second side surface 313 of the contact hole 310 and the lower surface 311 of the contact hole 310 may be about 170 degrees or more. An angle of at least a portion between the first side surface 312 of the contact hole 310 and the lower surface 311 of the contact hole 310 may be about 170 degrees or more.

When the angle θ between the second side surface 313 of the contact hole 310 and the lower surface 311 of the contact hole 310 is about 170 degrees or more, even though the external light may be incident through the opening portion 510 and be reflected by the portion of the pixel electrode 400 disposed on the second side surface 313, the reflected light from the portion of the pixel electrode 400 may not reach the opening portion 510. That is, the external light reflected by the portion of the pixel electrode 400 disposed on the second side surface 313 may not be emitted through the opening portion 510 and may be absorbed by the pixel defining layer 500.

Figure 10:
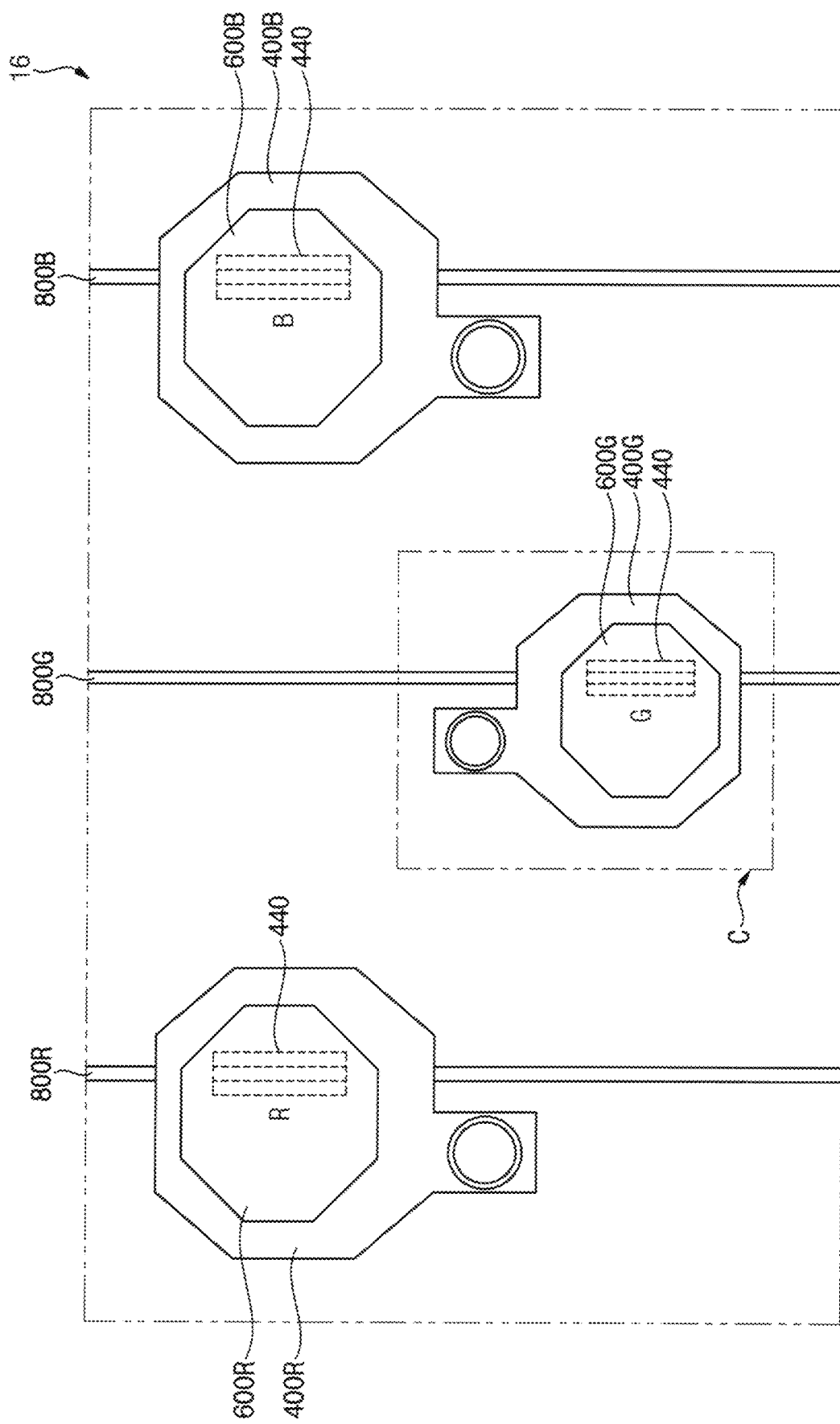
FIG. 10 is a plan view illustrating a display device according to an embodiment of the present invention.
Figure 11:
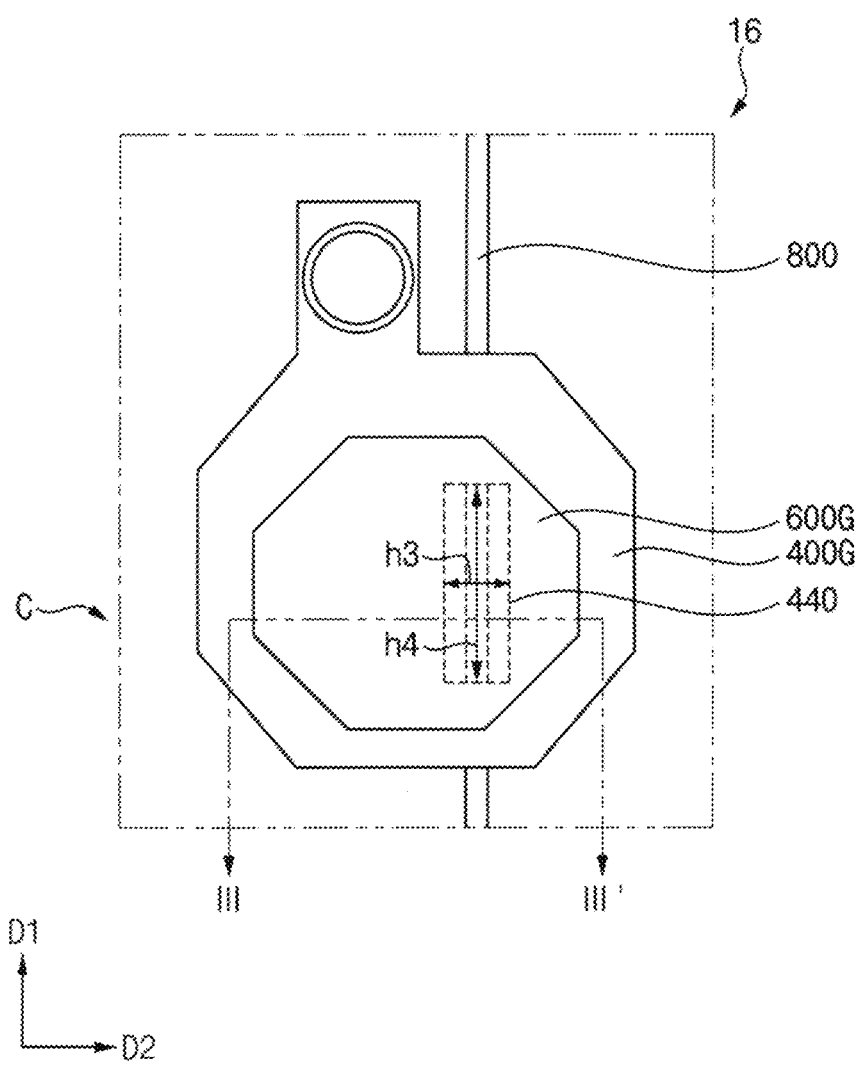
FIG. 11 is an enlarged plan view of area C of FIG. 10.
Figure 12:
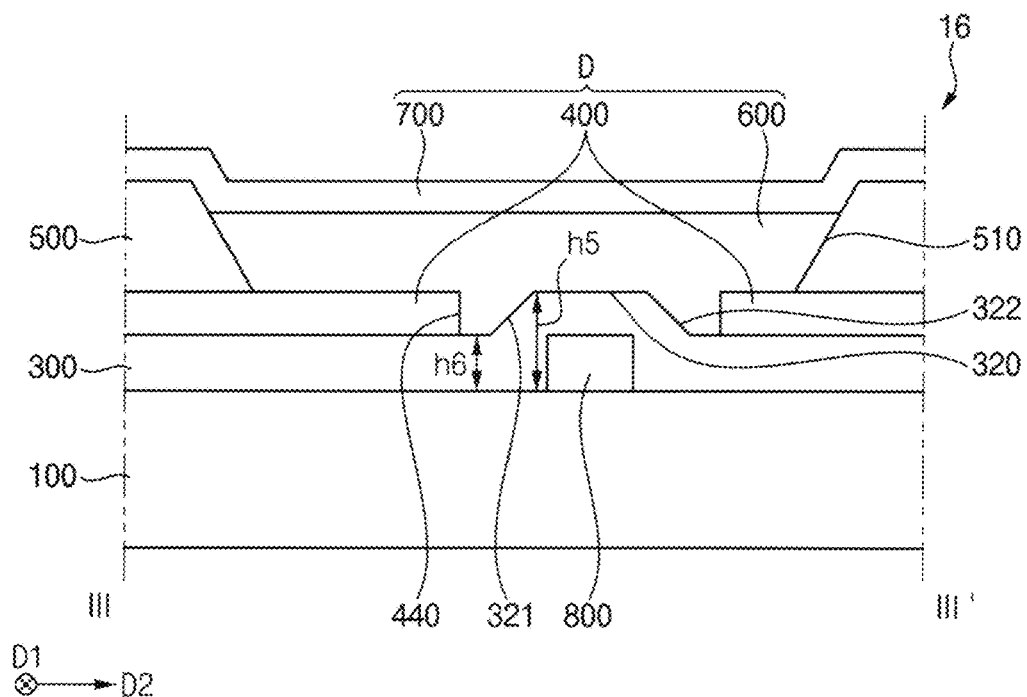
FIG. 12 is a cross-sectional view taken along line III-III' of FIG. 11.

FIG. 10 is a plan view of a display device according to an embodiment of the present invention. FIG. 11 is an enlarged plan view of area C of FIG. 10. FIG. 12 is a cross-sectional view taken along line of FIG. 11.

Referring to FIG. 10 and FIG. 11, the display device 16 according to an embodiment may include a first light emitting device R, a second light emitting device G and a third light emitting device B. The first light emitting device R may include a first pixel electrode 400R and a first light emitting layer 600R and a first wiring 800R may be disposed under the first light emitting device R. The second light emitting device G may include a second pixel electrode 400G and a second light emitting layer 600G and a second wiring 800G may be disposed under the second light emitting device G. The third light emitting device B may include a third pixel electrode 400B and a third light emitting layer 600B and a third wiring 800B may be disposed under the third light emitting device B. Each of the first pixel electrode 400R, the second pixel electrode 400G and the third pixel electrode 400B may define an opening 440 therein.

The light emitting layer 600 may include a first light emitting layer 600R, a second light emitting layer 600G and a third light emitting layer 600B, and the pixel electrode 400 may include a first pixel electrode 400R, a second pixel electrode 400G and a third pixel electrode 400B. A wiring 800 may include a first wiring 800R, a second wiring 800G and a third wiring 800B.

Referring to FIG. 11 and FIG. 12, the display device 16 may include the substrate 100, the wiring 800, the insulation layer 300, the pixel electrode 400, the pixel defining layer 500, the light emitting layer 600 and the common electrode 700.

The wiring 800 may be disposed on the substrate 100. The wiring 800 may include a gate wiring (not shown), a data wiring (not shown), ELVDD wiring (not shown) etc. The gate wiring may be arranged in the first direction D1, for example, in a vertical direction, and the data wiring may be arranged in the second direction D2, for example, in a horizontal direction. The wiring 800 may be disposed under the pixel electrode 400 and a plurality of wirings may be disposed under the pixel electrode 400.

The wiring 800 may be disposed in a center of the light emitting layer 600. When the wiring 800 is disposed in the center of the light emitting layer 600, the light emitting layer 600 may be symmetrical with respect to the wiring 800. Accordingly, a light reflected by the pixel electrode 400 may be equally reflected in all directions. Thus, the diffused reflection may be effectively reduced.

The insulation layer 300 may be disposed on the wiring 800. The insulation layer 300 may remove a step in order to improve a luminous efficiency of the light emitting layer 600 disposed on the insulation layer 300. The insulation layer 300 may flatten the step. The insulation layer 300 may overlap the wiring 800 and may cover the wiring 800. The insulation layer may include, for example, an organic insulating material. The organic insulating material may include polyimide, polyamide, polyacrylate, unsaturated polyester, epoxy resin, phenol resin, etc., but the invention is not limited thereto.

The insulation layer 300 may include a flat portion 320 overlapping a center portion of the wiring 800 in a plan view and a first stepped portion 321 and a second stepped portion 322 disposed on opposite sides of the flat portion 320. In other words, the flat portion 320 may be a portion overlapping the center portion of the wiring 800 in a plan view, and may be a flat portion of protruding portions from an upper surface of the insulation layer 300 by the wiring 800. The first stepped portion 321 and the second stepped portion 322 may be a portion in which a stepped portion among portions protruding by the wiring 800. The flat portion 320 may be disposed between the first stepped portion 321 and the second stepped portion 322. A height h5 from the substrate 100 to the upper surface of the flat portion 320 may be greater than a height h6 from the substrate 100 to the upper surface of a portion of the insulation layer 300 overlapping the pixel electrode 400 in a plan view.

The pixel electrode 400 may be disposed on the insulation layer 300. The pixel electrode 400 may include a reflective conductive material, a semi-transmissive conductive material or a transparent conductive material. For example, the pixel electrode 400 may include at least one of the transparent conductive materials such as indium tin oxide (ITO) and indium zinc oxide (IZO) and a metal such as lithium (Li), calcium (Ca), aluminum (Al), silver (Ag), magnesium (Mg) and gold (Au).

In the prior art, since a pixel electrode overlaps a wiring disposed under the pixel electrode, a step of the pixel electrode may be formed by the wiring. Specifically, a plurality of stepped portions is formed in an insulation layer by the wiring, a step may be formed by the stepped portions in the pixel electrode. Thus, an external light entering from an opening portion or a light emitted by the light emitting layer may be reflected by the step of the pixel electrode. That is, the same amount of the light may not be reflected in all directions, but a different amount of light may be reflected in all directions or a light of a specific color may be reflected in a specific direction. In other words, the diffused reflection may occur.

But in the embodiments of the present invention, when the external light or the light emitted by the light emitting layer 600 is reflected, the step of the pixel electrode overlapping the edge of the wiring 800 in a plan view may be removed, and the upper surface of the pixel electrode 400 may be formed flat. That is, since the opening 440 of the pixel electrode 400 is formed in the step of the pixel electrode 400, the step of the pixel electrode 400 may be removed. Thus, the diffused reflection may be effectively reduced.

The pixel electrode 400 may include at least one of the opening 440. The opening 440 may overlap at least one of the flat portion 320, the first stepped portion 321 and the second stepped portion 322 of the insulation layer 300 in a plan view. That is, since the opening 440 and the flat portion 320, the first stepped portion 321 and the second stepped portion 322 of the insulation layer 300 overlaps, the step of the pixel electrode 400 due to the insulation layer 300 may be removed. All four sides of the opening 440 of the pixel electrode 400 may be surrounded by the pixel electrode 400. However, a shape of the opening 440 of the pixel electrode 400 may not be limited thereto. When the pixel electrode 400 is formed, the step of the pixel electrode may be removed. In other words, during a patterning process forming the pixel electrode 400, a portion of pixel electrode overlapping at least one of the flat portion 320, the first stepped portion 321 and the second stepped portion 322 of the insulation layer 300 in a plan view may be removed. Accordingly, the diffused reflection may be effectively prevented.

In order to minimize the influence of the opening 440 on the light emitting device, the width of the opening 440 in the second direction D2 may be similar to a sum of a width of the flat portion 320 of the insulation layer 300 in the second direction and a width of the first stepped portion 321 and the second stepped portion 322 in the second direction. Thus, an area of the opening 440 may be effectively minimized.

Referring to FIG. 10 again, a size of the opening 440 may be different according to each of a size of the first to third light emitting devices. For example, a size of the first light emitting device R may be greater than a size of the second light emitting device G. Thus, the size of the opening 440 included in the first light emitting device R may be greater than the size of the opening 440 included in the second light emitting device G.

The opening 440 may overlap the first stepped portion 321, the second stepped portion 322 and the flat portion 320 in a plan view. That is, the one of the opening 440 may overlap an entirety of the first stepped portion 321, the second stepped portion 322 and the flat portion 320. The light emitting layer 600 and the insulation layer 300 may contact through the opening 440. Also, an upper surface of the pixel electrode 400 and an upper surface of the flat portion 320 of the insulation layer 300 may be disposed in the same level. Thus, a lower surface of the light emitting layer 600 may be disposed flatly on the pixel electrode 400, the diffused reflection may be effectively reduced.

According to a shape of the wiring 800 the length h3 of the opening 440 in the second direction D2 may be smaller than the length h4 of the opening 440 in the first direction D1. The first direction D1 may be a direction in which the wiring 800 is extended, the second direction D2 may be a direction orthogonal to a direction in which the wiring 800 is extended. A length h3 of the opening 440 in the second direction D2 may be formed differently according to the width of the wiring 800. That is, the size of the opening 440 may vary according to a type of the wiring 800.

The pixel defining layer 500 may be disposed on the insulation layer 300 and the pixel electrode 400. The pixel defining layer 500 may overlap a portion of the pixel electrode 400 in a plan view. The pixel defining layer 500 may absorb the external light entering from the outside through the opening portion 510, and may absorb a light reflected and emitted by the pixel electrode 400.

The pixel defining layer 500 may define an opening portion 510 overlapping the pixel electrode 400 in a plan view. The opening portion 510 of the pixel defining layer 500 may limit the area corresponding to the pixel. The opening portion 510 may have a polygonal shape or a circular shape and may have the polygonal shape such as a square, a triangle, a pentagon, a hexagon, a heptagon, and an octagon among the polygonal shape.

The pixel defining layer 500 may include an organic insulating material such as polyimide, polyacrylate, polyamide, but the invention is not limited thereto.

The light emitting layer 600 may be disposed on the pixel electrode 400. A hole injection layer, a hole transport layer may be disposed additionally between the light emitting layer 600 and the pixel electrode 400 and an electron injection layer and an electron transport layer may be disposed additionally between the light emitting layer 600 and the common electrode 700.

The light emitting layer 600 may contain a material emitting a light of red, green and blue. The light emitting layer 600 may include the first light emitting layer 600R emitting light having a first wavelength, the second light emitting layer 600G emitting light having a second wavelength and the third light emitting layer 600B emitting light having a third wavelength (see FIG. 1). For example, the light having the first wavelength may represent red, and the light having the second wavelength may represent green and the light the third wavelength may represent blue.

The light emitting layer 600 may have a structure which a plurality of organic materials emitting the light of different colors is stacked. Alternatively, the light emitting layer 600 may contain an inorganic material emitting the light of red, green and blue.

The common electrode 700 transmitting a common voltage may be disposed on the light emitting layer 600. The common electrode 700 may contain a transparent conductive material such as indium tin oxide (ITO) and indium zinc oxide (IZO). The common electrode 700 may be formed to have light transmittance by stacking calcium (Ca), barium (Ba), magnesium (Mg), aluminum (Al), and silver (Ag).

The pixel electrode 400, the light emitting layer 600 and the common electrode 700 may form a light emitting device D that is a light emitting diode. The pixel electrode 400 may be an anode that is a hole injection electrode and the common electrode 700 may be a cathode that is an electron injection electrode. Conversely, the pixel electrode 400 may be the cathode, and the common electrode 700 may be the anode. The hole and the electron may be injected into the light emitting layer from the pixel electrode 400 and the common electrode 700, respectively. When an exciton in which the injected holes and electrons are combined falls from an excited state to the ground state, the light emitting device D may emit light.

Although not shown in the drawing, the thin film encapsulation layer may be disposed on the common electrode 700. The thin film encapsulation layer may include a plurality of inorganic layers or may include a structure in which the inorganic layer and an organic layer are stacked.

Figure 13:
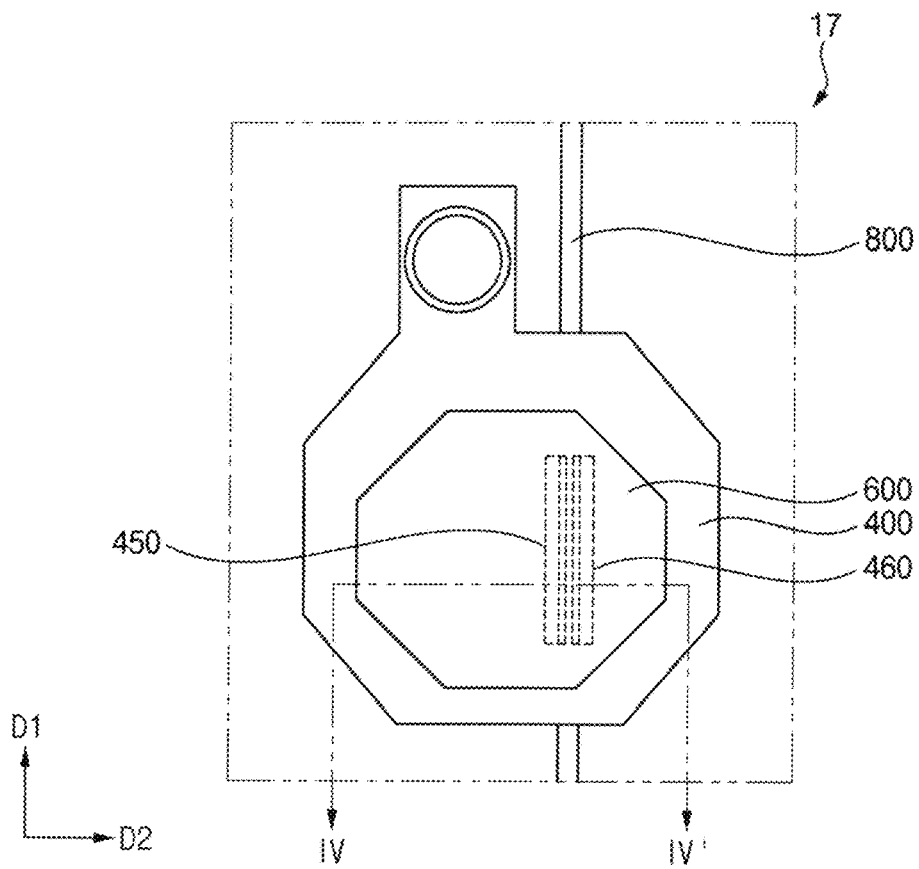
FIG. 13 is a plan view of a display device according to an embodiment of the present invention.
Figure 14:
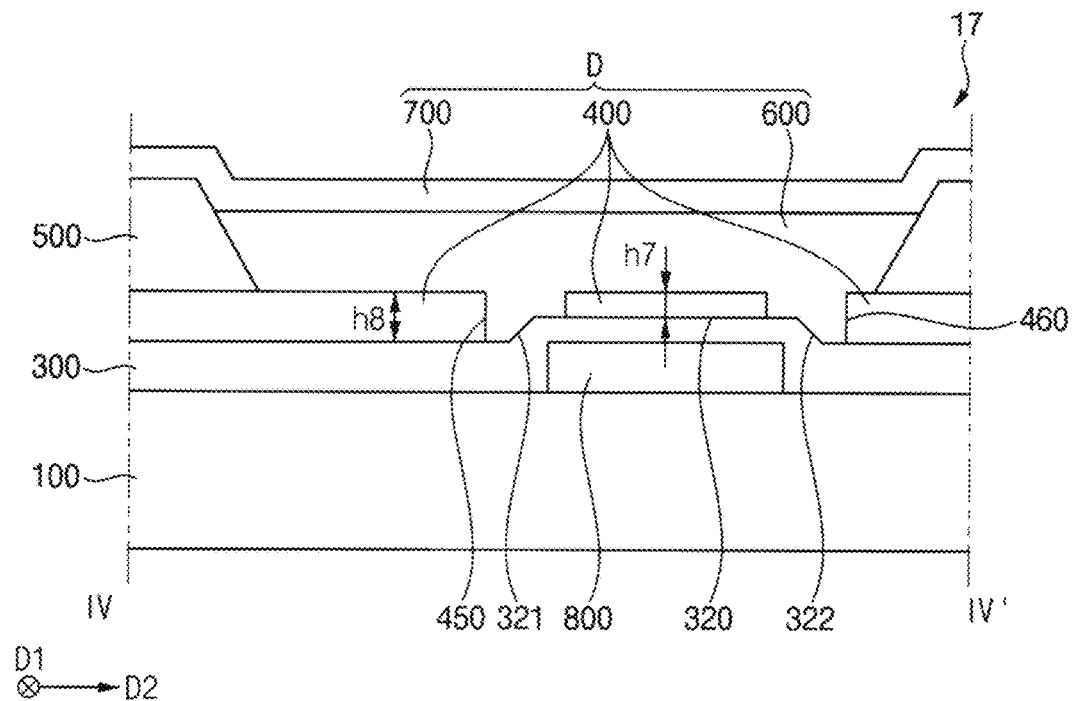
FIG. 14 is a cross-sectional view taken along line IV-IV' of FIG. 13.

FIG. 13 is a plan view of a display device according to an embodiment of the present invention. FIG. 14 is a cross-sectional view taken along line IV-IV' of FIG. 13.

Referring to FIG. 13 and FIG. 14, an opening 440 may include a first opening 450 and a second opening 460. The first opening 450 may overlap a first stepped portion 321, and the second opening 460 may overlap a second stepped portion 322. That is, the first opening 450 and the second opening 460 overlap the first stepped portion 321 and the second stepped portion 322 in a plan view, respectively, so that a step of the pixel electrode by the insulation layer 300 may be removed.

When the pixel electrode 400 is formed, the step of the pixel electrode 400 may be removed. In other words, during the patterning process forming the pixel electrode 400 a portion of the pixel electrode 400 overlapping the first stepped portion 321 and the second stepped portion 322 of the insulation layer 300 in a plan view. Thus, the diffused reflection may be effectively prevented.

When the pixel electrode 400 includes the first opening 450 and the second opening 460, an upper surface of the pixel electrode 400 disposed on the flat portion 320 and an upper surface of the rest may be disposed at the same level. That is, a height h7 of the upper surface of the pixel electrode 400 from the flat portion 320 may be smaller than a height h8 of the upper surface of the pixel electrode 400 from the insulation layer 300. Thus, a lower surface of the light emitting layer may be disposed flatly on the pixel electrode 400 and the diffused reflection may be effectively reduced.

An area of a sum of the first opening 450 and the second opening 460 may be smaller than an area of one opening overlapping the entirety of the first stepped portion 321, the second stepped portion 322 and the flat portion 320 in a plan view. Thus, the influence of the first opening 450 and the second opening 460 on the light emitting device may be smaller.

Figure 15:
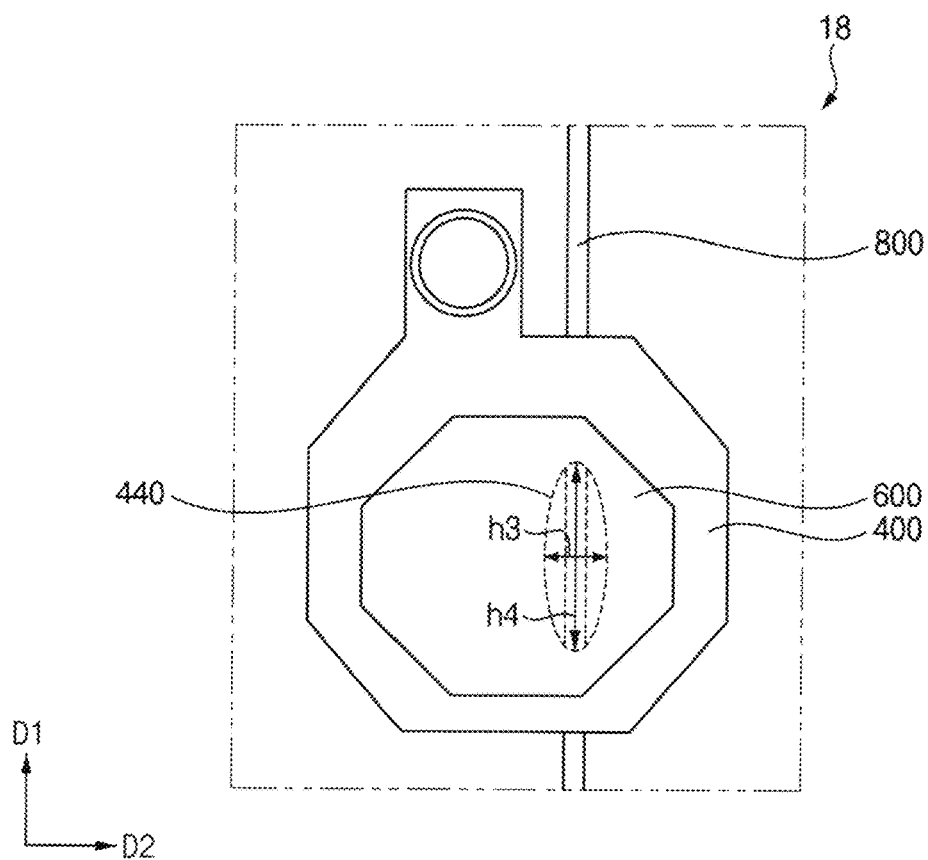
FIG. 15 is a plan view of a display device according to an embodiment.

FIG. 15 is a plan view of a display device according to an embodiment.

Referring to FIG. 15, the pixel electrode 400 of the display device 18 may define the opening 440. The shape of the opening 440 may be one of a circular shape and a square shape in the plan view. Referring to FIG. 11, the shape of the opening 440 may be the square. Referring to FIG. 15, the shape of the opening 440 may be the circular shape. The opening 440 may be formed in consideration of the shape of the wiring 800. In other words, the length h3 of the opening 440 in the second direction D2 may be smaller than the length h4 in the first direction D1 depending on the shape of the wiring 800. Thus, the shape of the opening 440 may be an elliptical shape of which a longitudinal direction is the first direction D1. However, the shape of the opening 440 according to the invention is not limited thereto.

Figure 16:
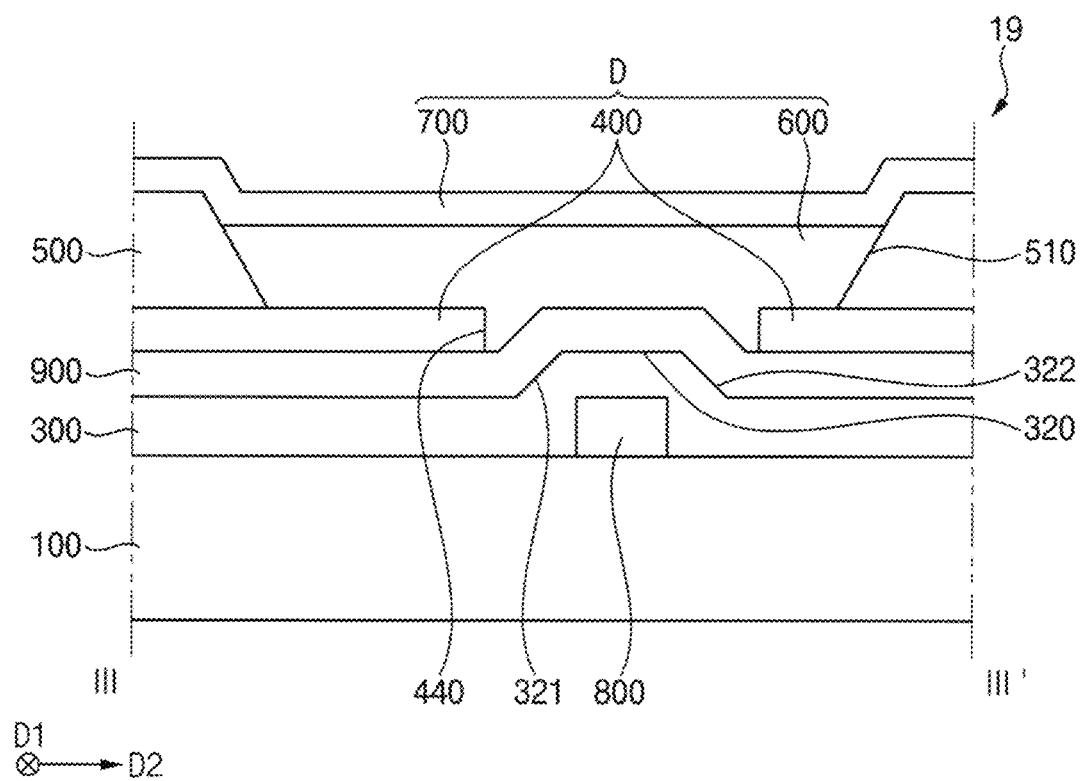
FIG. 16 is a cross-sectional view of a display device according to an embodiment.

FIG. 16 is a cross-sectional view of a display device according to an embodiment.

Referring to FIG. 16, the display device 19 may further include a low reflection layer 900 between the insulation layer 300 and the pixel electrode 400. The low reflection layer 900 may overlap the entire pixel electrode 400. The low reflection layer 900 may have a single layer, and may contain a material having a low reflectivity. The material having the low reflectivity may be a metal. For example, the material having the low reflectivity may be Mo, Ti, Zr, Hf, V, Nb, Ta, Cr, W and one or more alloys including the same. The reflectivity of the low reflection layer 900 may be lower than a reflectivity of the pixel electrode 400.

The low reflection layer 900 may be exposed through the opening 440 of the pixel electrode 400. The step of the pixel electrode 400 may be eliminated by the opening 440, thus the external light entering through the opening portion 510 may reach the low reflection layer 900. The most of the external light may be absorbed in the low reflection layer. Thus, if the display device 19 further includes the low reflection layer 900, the diffused reflection may be effectively reduced more.

Figure 17:
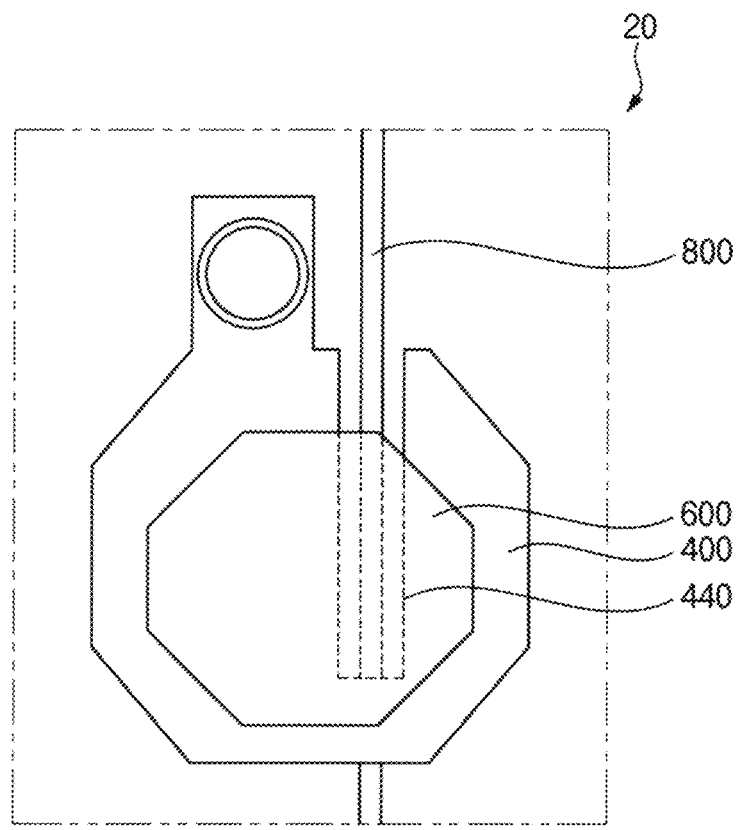
FIG. 17 is a plan view of a display device according to an embodiment.

FIG. 17 is a plan view of a display device according to an embodiment.

Referring to FIG. 17, the pixel electrode 400 of the display device 20 may include the opening 440. Components included in the display devices 16, 17, 18, 19 described with reference to FIG. 10 to FIG. 16 may be applied to the display device 20 of FIG. 17. Also, the same components as those of the display devices 16, 17, 18, 19 of the display device 20 of FIG. 17 have been described above, and thus will be omitted below.

The shape of the opening 440 may be a shape in which one side of the opening 440 is opened. That is, only three sides of the opening 440 may be surrounded by the pixel electrode 400. In an embodiment, the opening 440 of the pixel electrode 400 may be a shape opened in the first direction D1. However, the shape of the opening 440 according to the invention is not limited thereto, and in another embodiment, the opening 440 of the pixel electrode may be a shape opened in Direction D3 which is opposite to the Direction D1. The directions D1 and D3 may be the direction in which the wiring 800 extends. Also, the opening 440 may have a shape opened in both the directions D1 and D3.

The display device according to the embodiments of the present invention may be applied to a display device included in a computer, a notebook, a mobile phone, a smartphone, a smart pad, a PMP, a PDA, an MP3 player, or the like.

What is claimed is:

1. A display device comprising:
    a substrate;
    a thin film transistor disposed on the substrate;
    an insulation layer disposed on the thin film transistor and defining a contact hole having a bottom surface and a sidewall surface;
    a pixel electrode disposed on the insulation layer and overlapping a portion of the contact hole less than the entire bottom surface and the entire sidewall surface in a plan view; and
    a light emitting layer disposed on the pixel electrode,
    wherein the pixel electrode includes:
    a first portion overlapping the light emitting layer in the plan view;
    a second portion overlapping a portion of a lower surface of the contact hole in the plan view; and
    a third portion extending from the first portion to the second portion.

2. The display device of claim 1, wherein the contact hole penetrates the insulation layer, and
    wherein the lower surface of the contact hole exposes a portion of the thin film transistor.

3. The display device of claim 1, wherein the second portion is an end portion of the pixel electrode and disposed on the lower surface of the contact hole.

4. The display device of claim 1, wherein the contact hole is defined in a first direction from the light emitting layer in the plan view, and
    wherein a maximum length of the contact hole in the first direction is greater than a maximum length of the contact hole in a second direction crossing the first direction.

5. The display device of claim 4, wherein the contact hole has an elliptical shape in the plan view.

6. The display device of claim 4, wherein the contact hole has a water droplet shape in the plan view.

7. The display device of claim 1, wherein the second portion contacts the thin film transistor through the contact hole.

8. The display device of claim 1, wherein the thin film transistor includes,
    an active layer;
    a gate electrode disposed on the active layer; and
    a source electrode and a drain electrode disposed on the gate electrode and electrically connected to the active layer, and
    wherein the second portion overlaps at least one of the source electrode and the drain electrode in the plan view.

9. A display device comprising:
    a substrate;
    a thin film transistor disposed on the substrate;
    an insulation layer disposed on the thin film transistor and defining a contact hole;
    a pixel electrode overlapping the contact hole in a plan view and disposed on the insulation layer; and
    a light emitting layer disposed on the pixel electrode and entirely spaced apart from the contact hole in the plan view,
    wherein the contact hole is defined in a first direction from the light emitting layer in the plan view, and
    wherein a maximum length of the contact hole in the first direction is greater than a maximum length of the contact hole in a second direction crossing the first direction.

10. The display device of claim 9, wherein the contact hole has an elliptical shape in the plan view.

11. The display device of claim 9, wherein the contact hole has a water droplet shape in the plan view.

12. The display device of claim 9, wherein an angle of at least a portion between a side surface of the contact hole and a lower surface of the contact hole is about 170 degrees or more.

13. The display device of claim 9, wherein the contact hole penetrates the insulation layer, and the pixel electrode contacts the thin film transistor through the contact hole.

14. A display device comprising:
a substrate;
a wiring disposed on the substrate;
an insulation layer disposed on the wiring and including a flat portion overlapping the wiring in a plan view and a first stepped portion and a second stepped portion disposed on opposite sides of the flat portion;
a pixel electrode disposed on the insulation layer and defining an opening; and
a light emitting layer disposed on the pixel electrode,
wherein the opening overlaps at least one of the flat portion, the first stepped portion, and the second stepped portion in the plan view.

15. The display device of claim 14, wherein a height from the substrate to an upper surface of the flat portion is greater than a height from the substrate to an upper surface of a portion of the insulation layer overlapping the pixel electrode in the plan view.

16. The display device of claim 14, wherein the opening overlaps the first stepped portion, the second stepped portion, and the flat portion in the plan view.

17. The display device of claim 14, wherein the opening includes a first opening and a second opening, and
wherein the first opening and the second opening overlap the first stepped portion and the second stepped portion in the plan view, respectively.

18. The display device of claim 14, wherein the opening has one of a circular shape and a square shape in the plan view.

19. The display device of claim 14, further comprising:
a low reflection layer disposed between the insulation layer and the pixel electrode, and overlapping the opening in the plan view.

20. The display device of claim 19, wherein the low reflection layer includes a metal, and
wherein a reflectance of the low reflection layer is lower than a reflectance of the pixel electrode.

* * * * *